(12) United States Patent
Topaloglu et al.

(10) Patent No.: US 10,839,133 B1
(45) Date of Patent: Nov. 17, 2020

(54) CIRCUIT LAYOUT SIMILARITY METRIC FOR SEMICONDUCTOR TESTSITE COVERAGE

(71) Applicant: International Business Machines Corporation, Armonk, NY (US)

(72) Inventors: Rasit Onur Topaloglu, Poughkeepsie, NY (US); Dureseti Chidambarrao, Westin, CT (US); Werner A. Rausch, Stormville, NY (US); Leon Stok, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/412,404

(22) Filed: May 14, 2019

(51) Int. Cl.
 G06F 30/398 (2020.01)
 G06F 30/33 (2020.01)
 G06F 30/327 (2020.01)
 G06F 30/367 (2020.01)
 G06F 30/333 (2020.01)
 G01R 31/26 (2020.01)

(52) U.S. Cl.
 CPC ....... *G06F 30/398* (2020.01); *G01R 31/2607* (2013.01); *G06F 30/327* (2020.01); *G06F 30/33* (2020.01); *G06F 30/367* (2020.01); *G06F 30/333* (2020.01)

(58) Field of Classification Search
 USPC .................................................. 716/136
 See application file for complete search history.

(56) References Cited

U.S. PATENT DOCUMENTS

| | | | |
|---|---|---|---|
| 6,154,567 A | 11/2000 | McGarry | |
| 7,643,665 B2 | 1/2010 | Zavadsky et al. | |
| 8,227,266 B2 | 7/2012 | Mowry et al. | |
| 8,336,011 B2 | 12/2012 | Topaloglu | |
| 8,402,397 B2 | 3/2013 | Robles et al. | |
| 8,504,949 B2 | 8/2013 | Robles et al. | |
| 8,701,058 B2 | 4/2014 | Zavadsky et al. | |
| 9,182,680 B2 | 11/2015 | Ghinovker | |

(Continued)

OTHER PUBLICATIONS

Rasit O. Topaloglu, "ICCAD-2016 CAD contest in pattern classification for integrated circuit design space analysis and benchmark suite," Proceedings of the 35th International Conference on Computer-Aided Design, 2016, 4 pp. ICCAD '16, Nov. 7-10, 2016, Austin, TX, USA.

(Continued)

*Primary Examiner* — Bryce M Aisaka
(74) *Attorney, Agent, or Firm* — Erik Johnson; Otterstedt, Wallace & Kammer, LLP

(57) ABSTRACT

Methods and systems for a circuit similarity metric for semiconductor testsite coverage. One or more unique values for each of a set of measures for each circuit layout of a plurality of circuit layouts are identified and a pairwise comparison across the set of measures is conducted for a selected pair of the plurality of circuit layouts to derive a similarity score for the selected pair of circuit layouts. The similarity score is incremented for the selected pair in response to the selected pair of circuit layouts sharing a same unique value and the similarity score is decremented for the selected pair in response to one circuit layout of the selected pair of circuit layouts having a unique value that the other circuit layout of the selected pair does not contain.

20 Claims, 8 Drawing Sheets

(56) References Cited

U.S. PATENT DOCUMENTS

| | | | |
|---|---|---|---|
| 9,235,758 B1 | 1/2016 | Agrawal et al. | |
| 9,299,177 B2 | 3/2016 | Sakai et al. | |
| 2010/0202706 A1* | 8/2010 | Gabrani | G03F 7/70616 |
| | | | 382/224 |
| 2011/0088006 A1* | 4/2011 | Kojima | H01L 27/0207 |
| | | | 716/112 |

OTHER PUBLICATIONS

Wei-Chun Chang et al., "iClaire: A fast and general layout pattern classification algorithm," Proceedings of the 54th Annual Design Automation Conference 2017, 6 pp. DAC '17, Jun. 18-22, 2017, Austin, TX, USA.

Zeye Liu et al., "Front-end layout reflection for test chip design," International Test Conference (ITC), 2017, 12.2, 10 pp 2017 IEEE.

Yan-Shiun Wu et al., "MapReduce-based pattern classification for design space analysis," International Symposium on VLSI Design, Automation and Test (VLSI-DAT), 2018, 4 pp. In2018 International Symposium on VLSI Design, Automation and Test (VLSI-DAT) Apr. 16, 2018 (pp. 1-4). IEEE.

* cited by examiner

|  | Description | Total Entries | Unique |
|---|---|---|---|
| 104-1 → | Layer1 Locations | 1096 | 4 |
| 104-2 → | Layer2 Locations | 1024 | 4 |
|  | Layer1/Layer2 Overlap Vertical | 512 | 2 |
|  | Layer1/Layer2 Overlap Horizontal | 664 | 2 |
|  | Layer3 Size and Location | 3392 | 1 |
| 104-8 → | Layer4 EdgeY | 788 | 6 |
|  | Layer4 EdgeX | 6656 | 6 |

*FIG. 1A*

| Dir | Mx | Pol |
|---|---|---|
| V | 0 | + |
| V | 0 | + |
| V | 0 | + |
| V | 28 | + |
| V | 28 | + |
| V | 28 | + |
| V | 14 | + |
| V | 14 | + |
| V | 22 | + |
| V | 22 | + |

*FIG. 1B*

| | AOI21 | XNOR2 | NAND4 | NAND2 | ESLAT | NAND2 | OAI21 | L2SFF | SDFFQ | OAI21 | NOR2 | AOI22 | DFFQ |
|---|---|---|---|---|---|---|---|---|---|---|---|---|---|
| INV_X | 22 | 24 | 31 | 31 | -11 | 32 | 24 | 9 | 2 | 23 | 32 | 24 | 7 |
| NOR4 | 45 | 47 | 63 | 48 | 6 | 46 | 41 | 23 | 22 | 46 | 46 | 47 | 36 |
| OAI22 | 60 | 59 | 45 | 48 | -6 | 46 | 56 | 8 | 7 | 61 | 46 | 62 | 33 |
| XOR2 | 51 | 62 | 42 | 45 | 0 | 43 | 50 | 11 | 22 | 52 | 43 | 53 | 42 |
| NOR3 | 42 | 41 | 57 | 45 | 3 | 43 | 41 | 20 | 16 | 43 | 43 | 44 | 33 |
| NAND3 | 52 | 48 | 46 | 52 | -8 | 50 | 48 | 9 | 5 | 53 | 50 | 54 | 31 |
| INV_X5 | 22 | 24 | 31 | 31 | -11 | 32 | 24 | 9 | 2 | 23 | 32 | 24 | 7 |
| NOR4 | 45 | 47 | 63 | 48 | 6 | 46 | 41 | 23 | 22 | 46 | 46 | 47 | 36 |
| AOI22 | 62 | 58 | 47 | 50 | -7 | 48 | 55 | 10 | 6 | 60 | 48 | 64 | 32 |
| ELAT_X | 21 | 23 | 33 | 27 | 30 | 25 | 20 | 47 | 43 | 19 | 25 | 23 | 42 |
| N1LAT | 4 | 12 | 19 | 7 | 58 | 5 | 6 | 45 | 38 | 5 | 5 | 6 | 46 |
| AOI22 | 62 | 58 | 47 | 50 | -7 | 48 | 55 | 10 | 6 | 60 | 48 | 64 | 32 |
| NOR2 | 48 | 50 | 48 | 60 | -6 | 58 | 47 | 14 | 7 | 49 | 58 | 50 | 33 |
| NOR3 | 43 | 39 | 55 | 43 | 1 | 41 | 39 | 18 | 14 | 44 | 41 | 45 | 31 |
| ESLAT | 2 | 13 | 17 | 5 | 80 | 3 | 4 | 43 | 39 | 3 | 3 | 4 | 44 |
| NOR2 | 46 | 48 | 46 | 58 | -8 | 59 | 45 | 12 | 5 | 47 | 59 | 48 | 31 |
| NAND4 | 45 | 47 | 63 | 48 | 6 | 46 | 41 | 23 | 22 | 46 | 46 | 47 | 36 |
| N1LAT | 19 | 21 | 31 | 19 | 34 | 17 | 15 | 48 | 59 | 17 | 17 | 21 | 46 |
| SDFFQ | -4 | 4 | 11 | -4 | 56 | -6 | -5 | 40 | 21 | -3 | -6 | -2 | 23 |
| NAND4 | 45 | 47 | 63 | 48 | 6 | 46 | 41 | 23 | 22 | 46 | 46 | 47 | 36 |
| OAI21 | 61 | 57 | 43 | 46 | -8 | 44 | 57 | 6 | 5 | 59 | 44 | 60 | 31 |

*FIG. 3*

| Cells | Total | Unique |
|---|---|---|
| Latch Type 1 | 93 | 16 |
| Latch Type 2 | 19 | 11 |
| Latch Type 3 | 19 | 11 |
| Latch Type 4 | 15 | 9 |
| Latch Type 5 | 15 | 9 |
| Latch Type 6 | 10 | 3 |
| Latch Type 7 | 4 | 2 |
| Latch Type 8 | 4 | 1 |
| Latch Type 9 | 2 | 1 |
| Latch Type 10 | 2 | 1 |
| Latch Type 11 | 1 | 1 |

*FIG. 4*

CIRCUIT LAYOUT SIMILARITY METRIC FOR SEMICONDUCTOR TESTSITE COVERAGE

BACKGROUND

The present invention relates to the electrical, electronic, and computer arts, and, more specifically, to design and manufacture of integrated circuits (ICs).

When building semiconductor testsites, the representation of a wide range of layouts (such as cells and the like) should be ensured on the testsite. Testsites are used in the product development stage to test out parts of a bigger product. Usually, testsite design cycles are short and space is very limited, so it is desirable to be able to identify layouts that are similar to and/or very different from others, in case one layout is not suitable for a testsite. For example, only layouts of certain logic operation(s) may be suitable, perhaps because of circuit logic reasons. In such cases, there is a need to substitute in layouts that exercise similar layout content so that testsite coverage of certain design patterns are maintained.

Conventional techniques for building semiconductor testsites focus on pattern-based flows. Patterns are unique or generalized layout snippets and can contain one to two layers of polygons. Pattern search and pattern classification are also prevalent. For example, given a layout and anchor points, one can identify patterns that represent all layouts. The use of patterns has heretofore focused on 1) eliminating problematic layouts from a design after a search or 2) only allowing some patterns (e.g. special constructs) to be printed on silicon even though they would otherwise fail standard design rule checks (DRC).

SUMMARY

Aspects of the invention provide techniques for a circuit layout similarity metric for semiconductor testsite coverage. In one aspect, an exemplary method includes the step of identifying one or more unique values for each of a set of measures for each circuit layout of a plurality of circuit layouts; conducting a pairwise comparison across the set of measures for a selected pair of the plurality of circuit layouts to derive a similarity score for the selected pair of circuit layouts; performing at least one action in response to the conducting the pairwise comparison, the action being one of incrementing the similarity score for the selected pair, decrementing the similarity score for the selected pair, and maintaining the similarity score for the selected pair; repeating the identifying, conducting, and performing operations for each unique pair of circuit layouts of the plurality of circuit layouts; and substituting an alternative circuit layout for a given circuit layout based on the similarity score.

In one aspect, an exemplary non-transitory computer readable medium comprises computer executable instructions which when executed by a computer performing electronic design analysis cause the computer to perform a method which improves the performance of the computer, the method comprising operations of: identifying one or more unique values for each of a set of measures for each circuit layout of a plurality of circuit layouts; conducting a pairwise comparison across the set of measures for a selected pair of the plurality of circuit layouts to derive a similarity score for the selected pair of circuit layouts; performing at least one action in response to the conducting the pairwise comparison, the action being one of incrementing the similarity score for the selected pair, decrementing the similarity score for the selected pair, and maintaining the similarity score for the selected pair; repeating the identifying, conducting, and performing operations for each unique pair of circuit layouts of the plurality of circuit layouts; and substituting an alternative circuit layout for a given circuit layout based on the similarity score.

In one aspect, an exemplary computer comprises a memory; and at least one processor, coupled to said memory, and operative to perform operations comprising: identifying one or more unique values for each of a set of measures for each circuit layout of a plurality of circuit layouts; conducting a pairwise comparison across the set of measures for a selected pair of the plurality of circuit layouts to derive a similarity score for the selected pair of circuit layouts; performing at least one action in response to the conducting the pairwise comparison, the action being one of incrementing the similarity score for the selected pair, decrementing the similarity score for the selected pair, and maintaining the similarity score for the selected pair; repeating the identifying, conducting, and performing operations for each unique pair of circuit layouts of the plurality of circuit layouts; and substituting an alternative circuit layout for a given circuit layout based on the similarity score.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) (e.g., a computer) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

identification of similar circuit layouts;

assistance in selecting an alternative layout by a user or EDA tool;

reduction in computational complexity and processing time for identifying similar or uniquely different layouts;

selection by a user or EDA tool of circuit layouts that do not resemble each other to increase testsite coverage of new layout patterns;

reduction in computational complexity and processing time for computing a testsite coverage metric; and representation of different layouts on testsite silicon, which helps fix issues prior to production of a silicon product.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 1A-1B illustrate an example measure-based chip design flow, in accordance with an example embodiment;

FIG. 3 illustrates a representative portion of a similarity matrix for a latch library, in accordance with an example embodiment;

FIG. 4 is list of alternative layouts, in accordance with an example embodiment;

DETAILED DESCRIPTION

Figure 2:
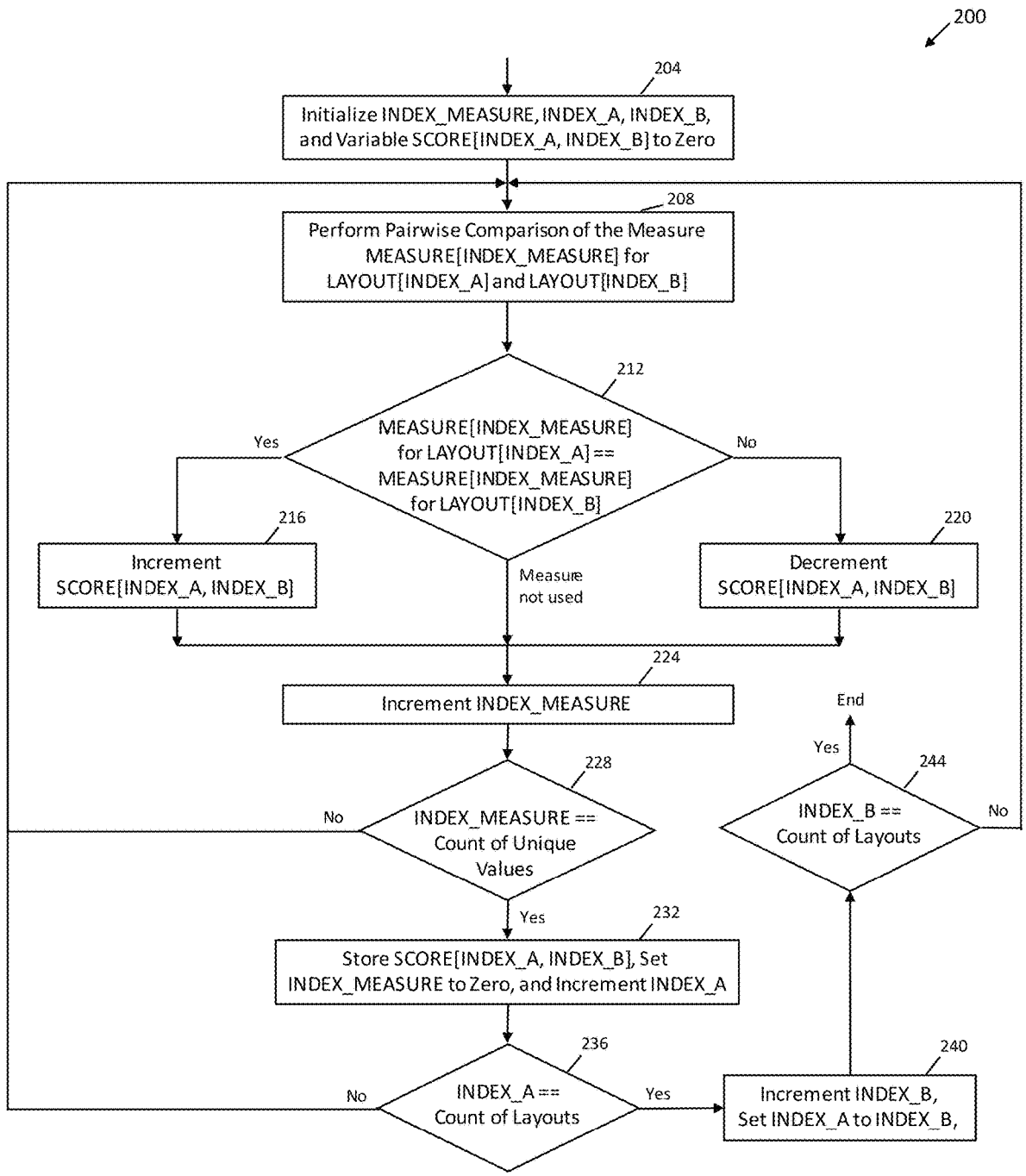
FIG. 2 is a flowchart of an example method for determining layout similarity and a testsite coverage metric, in accordance with an example embodiment.

Generally, a metric for determining similar layouts (such as similar cells) of a semiconductor testsite is disclosed. In one example embodiment, the metric is used to identify alternative layouts that can be used as a substitute for a given layout. The use of alternate layouts increases the size of the design space that is represented by the testsite while maintaining the original logic functionality. In one example embodiment, each layout is compared with respect to a common set of measures and one or more unique values are identified for each measure. A pairwise comparison of the identified unique values is conducted across a plurality of layouts. In one example embodiment, if two layouts share the same unique value for a selected measure, a similarity score for the corresponding pair of layouts is incremented. If one layout has a unique value for a selected measure that the other layout does not contain, the similarity score for the corresponding pair of layouts is decremented. If both layouts do not have any value for a selected measure, the similarity score for the corresponding pair of layouts is left unchanged.

After processing the layouts, a matrix of similarity scores is produced, where each entry in the matrix corresponds to two different layouts. In the matrix, a large score indicates a high degree of similarity between a pair of layouts and a low score indicates a low degree of similarity between the pair of layouts. Using the matrix, a similar layout can be selected for substitution for a given layout, or a portion of a given layout. In instances where certain layouts are not suitable and are to be excluded, the matrix is used to find an alternative (similar) layout to replace the layout to be excluded. In one example embodiment, a greedy or heuristic algorithm, or dynamic programming, is used to determine a list of layouts to substitute for a list of excluded layouts.

In one example embodiment, a testsite coverage metric for selected measures is computed. The testsite coverage metric represents a confidence level that the testsite is representative of the associated design library. The process of adding layouts to a testsite can be repeated until a target testsite coverage goal is met, until the process is terminated after a preset number of trials, and the like.

FIGS. 1A-1B illustrate an example measure-based chip design flow, in accordance with an example embodiment. This flow is used for design for manufacturability (DFM) optimization of layouts and identifies unique values per predefined measures. The example measure-based flow of FIGS. 1A-1B is based on 7 nm technology. Each measure 104-1, 104-2, . . . 104-8, . . . 104-N (collectively known as measures 104 herein) takes a cell boundary and periodic structures, such as poly silicon/fin structure, as reference, and derives a relatively small number of unique values 112 for each measure 104. As illustrated in FIG. 1A, for each measure 104, the count of total entries 108 and the count of unique values 112 observed for the corresponding measure 104 is recorded. FIG. 1B illustrates the ten unique values that resulted for measure 104-8 (the measure labelled Layer4 EdgeY in FIG. 1A). Here, direction (vertical vs. horizontal), alignment to the Mx metal layer grid, and polarity of measurement with respect to the grid can be reported. Appropriate columns for height, width, and other pertinent metrics can also be included in the table of FIG. 1B.

Representing the measure 104 based on patterns may require up to 10k patterns (layout snippets) in a pattern-based flow as opposed to a measure-based flow, as patterns are two- or three-dimensional and are more complex. Thus, due to the computational complexity (approximately two orders of magnitude as compared to a template-based flow), patterns have not conventionally been utilized for determining layout similarity or complexity. Generally, testsite coverage using patterns has been simplistic: ensure allowed patterns are included on a testsite and thus represented on silicon before a final product is produced. There are a few allowed patterns on a testsite, however, that may not be DRC-clean otherwise, so no special solution is needed and they can be tracked without developing an automated solution.

FIG. 2 is a flowchart of an example method 200 for determining layout similarity and a testsite coverage metric, in accordance with an example embodiment. In one example embodiment, each layout is compared with respect to a common set of measures 104 and unique values 112 for each measure 104 are identified for each layout. Initially, a trio of indexes (INDEX_MEASURE, INDEX_A and INDEX_B), and a matrix SCORE[INDEX_A, INDEX_B] are initialized to zero (operation 204). INDEX_MEASURE is an index for all of the unique values 112 that correspond to the selected measures 104 being processed. INDEX_A is an index for the first layout in a pair of layouts being compared and INDEX_B is an index for the second layout in the pair. Matrix SCORE[INDEX_A, INDEX_B] is the pending score for the pair of layouts corresponding to INDEX_A and INDEX_B.

A pairwise comparison of each of the unique values 112 that correspond to the selected measures 104 is conducted: compare measure[INDEX_MEASURE] of layout[INDEX_A] and measure[INDEX_MEASURE] of layout[INDEX_B] (operation 208). A check is performed to determine if the two layouts (layout[INDEX_A] and layout[INDEX_B]) share the same unique value 112 identified by INDEX_MEASURE (operation 212). If the two layouts (layout[INDEX_A] and layout[INDEX_B]) share the same unique value 112 for measure[INDEX_MEASURE] (YES branch of decision block 212), the similarity score SCORE

[INDEX_A, INDEX_B] is incremented (operation 216), and logical flow proceeds to operation 224. If one layout has a unique value 112 identified by INDEX_MEASURE that the other layout does not contain (NO branch of decision block 212), the similarity score SCORE[INDEX_A, INDEX_B] is decremented (operation 220), and logical flow proceeds to operation 224. If neither layout has the unique value 116 identified by INDEX_MEASURE ("Measure not used" branch of decision block 212), the similarity score SCORE [INDEX_A, INDEX_B] is left unchanged and the method 200 proceeds with operation 224.

During operation 224, INDEX_MEASURE is incremented and a check is performed to determine if INDEX_MEASURE equals the total count of unique values 112 (operation 228). If INDEX_MEASURE does not equal the total count of unique values 112 (NO branch of decision block 228), then not all unique values 112 have been processed and the method 200 proceeds with operation 208; otherwise (YES branch of decision block 228), the similarity score SCORE[INDEX_A, INDEX_B] is stored, INDEX_MEASURE is set to zero, and INDEX_A is incremented (operation 232). A check is performed to determine if INDEX_A equals the total count of layouts (operation 236). If INDEX_A does not equal the total count of layouts (NO branch of decision block 236), then layout[INDEX_B] has not been compared to all the other layouts and the method 200 proceeds with operation 208; otherwise (YES branch of decision block 236), layout[INDEX_B] has been compared to all the other layouts; INDEX_B is incremented and INDEX_A is set to INDEX_B (operation 240).

A check is performed to determine if INDEX_B equals the total count of layouts (operation 244). If INDEX_B does not equal the total count of layouts (NO branch of decision block 244), the method 200 proceeds with operation 208; otherwise (YES branch of decision block 244), the method 200 ends.

A result of method 200 is a matrix of similarity scores. FIG. 3 illustrates a representative portion of a similarity matrix for a latch library, in accordance with an example embodiment. As illustrated in FIG. 3, some pairs of layouts exhibit a high degree of similarity while other pairs of layouts exhibit a low degree of similarity (as indicated by the corresponding similarity scores). For example, layouts ESLAT and ESLATS have a similarity score of 80 and thus exhibit a high degree of similarity, and layouts INV_X5 and ESLATS have a similarity score of −11 and thus exhibit a low degree of similarity. Using the matrix of similarity scores, a similar layout can be selected for substitution for a given layout. For example, in instances where certain layouts are not suitable (and are to be excluded), the matrix is used to find an alternative (similar) layout that can be substituted for the layout to be excluded. A layout with a high similarity score may be selected.

In one example embodiment, a testsite coverage metric for selected measures is computed. The testsite coverage metric represents a confidence level that the testsite is representative of the associated design library. It is possible that the selected substitute layout is similar only in regard to a subset of the plurality of selected measures and thus the testsite coverage is less than 100%. In this case, to increase the coverage, additional layouts may be added to the testsite, or layouts exhibiting better coverage may be substituted for the selected layouts. In one example embodiment, a common set of layouts that represents excluded layouts (cells) is determined using a greedy or heuristic algorithm, or dynamic programming. For example, the layouts may be ranked by their similarity score with the target layout (the layout to be replaced) and the highest scoring layouts that have measures in common with the target layout and that are not common with any of the previously selected layouts may be added to the testsite. The process of adding or substituting layouts may be repeated until a target testsite coverage goal is met, a preset number of layouts have been added, or a predefined number of comparisons have been performed.

In one example embodiment, given a list of layouts to be excluded from the testsite, a list of layouts is generated which will provide 100% testsite coverage, or close to 100% testsite coverage. FIG. 4 is list of alternative layouts, in accordance with an example embodiment. The column labeled unique is the count of unique configurations (layouts) for the corresponding type of device utilizing a unique window size (such as 50×50 nm, 100×100 nm, and the like). The column labeled total indicates the total count of instances over all of the unique configurations used in all instances of the corresponding device and other devices that utilize the unique configurations of the corresponding device. For example, insertion of layout type1 latch can yield 97% coverage as compared to compared to a conventional coverage of 90%. Substituting in type2 latch alone can yield 93% coverage as compared to conventional coverage of 90%. The output layout (cell) list can be linked to a placement and routing (P&R) tool for further automation; in one or more exemplary embodiments, placement only utilizes the given include/exclude cell list. Layout coverage increases as these new layouts being substituted in are different from the ones on the testsites, i.e., they have additional unique measure values that the ones on the testsite do not have. A coverage of 100% on a testsite indicates all unique measure values are represented. Anything below 100% indicates that layouts with some unique measure values were not represented on a testsite even though they may be introduced later on for a product.

If a measure-based flow is not available, patterns could be used in a similar manner to "measure values," as described above, where a similarity matrix is computed based on patterns, although this would be computationally more expensive.

Given the discussion thus far, it will be appreciated that, in general terms, an exemplary method includes identifying one or more unique values 112 for each of a set of measures 104 for each circuit layout of a plurality of circuit layouts; conducting a pairwise comparison across the set of measures 104 for a selected pair of the plurality of circuit layouts to derive a similarity score for the selected pair of circuit layouts 208; performing at least one action in response to the conducting the pairwise comparison, the action being one of incrementing the similarity score for the selected pair 216, decrementing the similarity score for the selected pair 220, and maintaining the similarity score for the selected pair; repeating the identifying, conducting, and performing operations for each unique pair of circuit layouts of the plurality of circuit layouts; and substituting an alternative circuit layout for a given circuit layout based on the similarity score.

In one aspect, an exemplary non-transitory computer readable medium comprises computer executable instructions which when executed by a computer performing electronic design analysis cause the computer to perform a method which improves the performance of the computer, the method comprising operations of: identifying one or more unique values 112 for each of a set of measures 104 for each circuit layout of a plurality of circuit layouts; conducting a pairwise comparison across the set of measures 104 for a selected pair of the plurality of circuit layouts to derive a similarity score for the selected pair of circuit layouts 208; performing at least one action in response to the conducting the pairwise comparison, the action being one of incrementing the similarity score for the selected pair 216, decrementing the similarity score for the selected pair 220, and maintaining the similarity score for the selected pair; repeating the identifying, conducting, and performing operations for each unique pair of circuit layouts of the plurality of circuit layouts; and substituting an alternative circuit layout for a given circuit layout based on the similarity score.

In one aspect, an exemplary computer comprises a memory; and at least one processor, coupled to said memory, and operative to perform operations comprising: identifying one or more unique values 112 for each of a set of measures 104 for each circuit layout of a plurality of circuit layouts; conducting a pairwise comparison across the set of measures 104 for a selected pair of the plurality of circuit layouts to derive a similarity score for the selected pair of circuit layouts 208; performing at least one action in response to the conducting the pairwise comparison, the action being one of incrementing the similarity score for the selected pair 216, decrementing the similarity score for the selected pair 220, and maintaining the similarity score for the selected pair; repeating the identifying, conducting, and performing operations for each unique pair of circuit layouts of the plurality of circuit layouts; and substituting an alternative circuit layout for a given circuit layout based on the similarity score.

In one example embodiment, a similarity matrix of similarity scores is created across all circuit layouts of the plurality of circuit layouts. In one example embodiment, a list of exclusion circuit layouts is obtained and a list of alternative circuit layouts is determined based on the similarity matrix. In one example embodiment, the list of alternative circuit layouts is pruned using a greedy or heuristic algorithm, or dynamic programming to generate a representative set of circuit layouts. In one example embodiment, a coverage metric is computed using a selected set of circuit layouts.

In one example embodiment, a circuit layout is added to the selected set of circuit layouts until a coverage goal is satisfied or an iteration limit is reached. In one example embodiment, a circuit layout is added to the selected set of circuit layouts, wherein the added circuit layout covers at least one unique value not covered by any circuit layout in the selected set of circuit layouts. In one example embodiment, a computing performance of identifying a circuit layout of the plurality of circuit layouts that is similar to a given circuit layout is improved by conducting the pairwise comparison across the set of measures 104 and deriving the similarity score using one or more of the unique values 112. In one example embodiment, the incrementing the similarity score for the selected pair is performed in response to the selected pair of circuit layouts sharing a same unique value and the decrementing the similarity score for the selected pair is performed in response to one circuit layout of the selected pair of circuit layouts having a unique value that the other circuit layout of the selected pair does not contain.

In one or more embodiments, a further step includes instantiating at least one of the plurality of circuit layouts as a design structure; and fabricating a physical integrated circuit in accordance with the design structure. One non-limiting specific example of accomplishing this is described elsewhere herein in connection with FIGS. 5-7. For example, a design structure, based on the analyzed design, is provided to fabrication equipment to facilitate fabrication of a physical integrated circuit in accordance with the design structure.

In one or more embodiments, a layout is prepared based on the analysis.

In one or more embodiments, the layout is instantiated as a design structure.

In one or more embodiments, a physical integrated circuit is fabricated in accordance with the design structure.

As noted, in one or more embodiments, the layout is instantiated as a design structure. See discussion of FIG. 5. A physical integrated circuit is then fabricated in accordance with the design structure. See again discussion of FIG. 5. Refer also to FIG. 6. One or more embodiments can be used as input to step 903 in FIG. 7, and affect the output of step 919 in FIG. 7 as well. Once the physical design data is obtained, based, in part, on the analytical processes described herein, an integrated circuit designed in accordance therewith can be fabricated according to known processes that are generally described with reference to FIG. 6. Generally, a wafer with multiple copies of the final design is fabricated and cut (i.e., diced) such that each die is one copy of the integrated circuit. At block 810, the processes include fabricating masks for lithography based on the finalized physical layout. At block 820, fabricating the wafer includes using the masks to perform photolithography and etching. Once the wafer is diced, testing and sorting each die is performed at 830 to filter out any faulty die.

Figure 8:
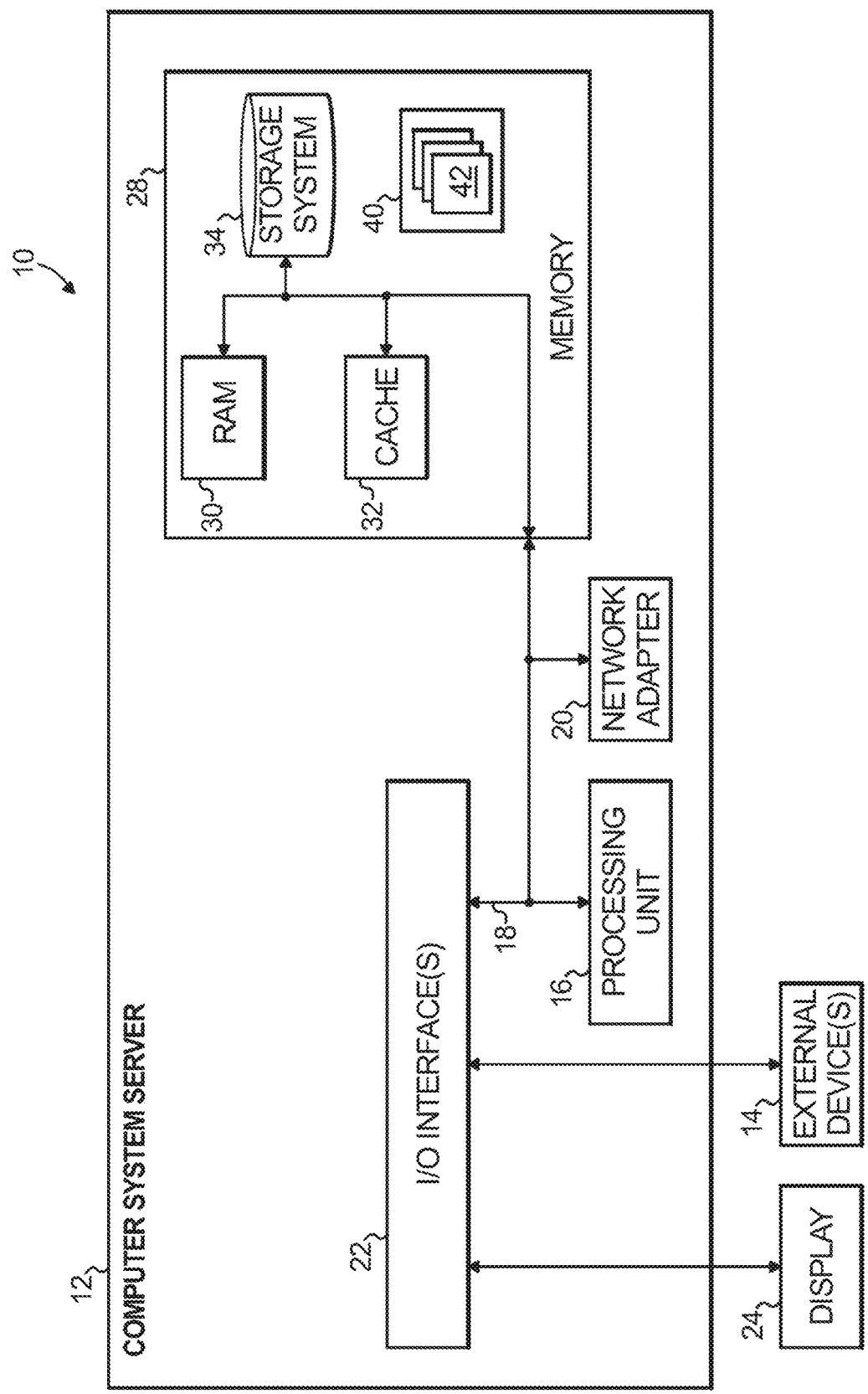
FIG. 8 depicts a computer system that may be useful in implementing one or more aspects and/or elements of the invention.

One or more embodiments make use of a computer including a memory 28; and at least one processor 16, coupled to the memory, and operative to carry out or otherwise facilitate any one, some, or all of the method steps described herein (as depicted in FIG. 8). In one or more embodiments, the performance (speed) of this computer is improved, for example, by a reduction in computational complexity and processing time for identifying similar or uniquely different layouts; and a reduction in computational complexity and processing time for computing a testsite coverage metric.

Figure 5:
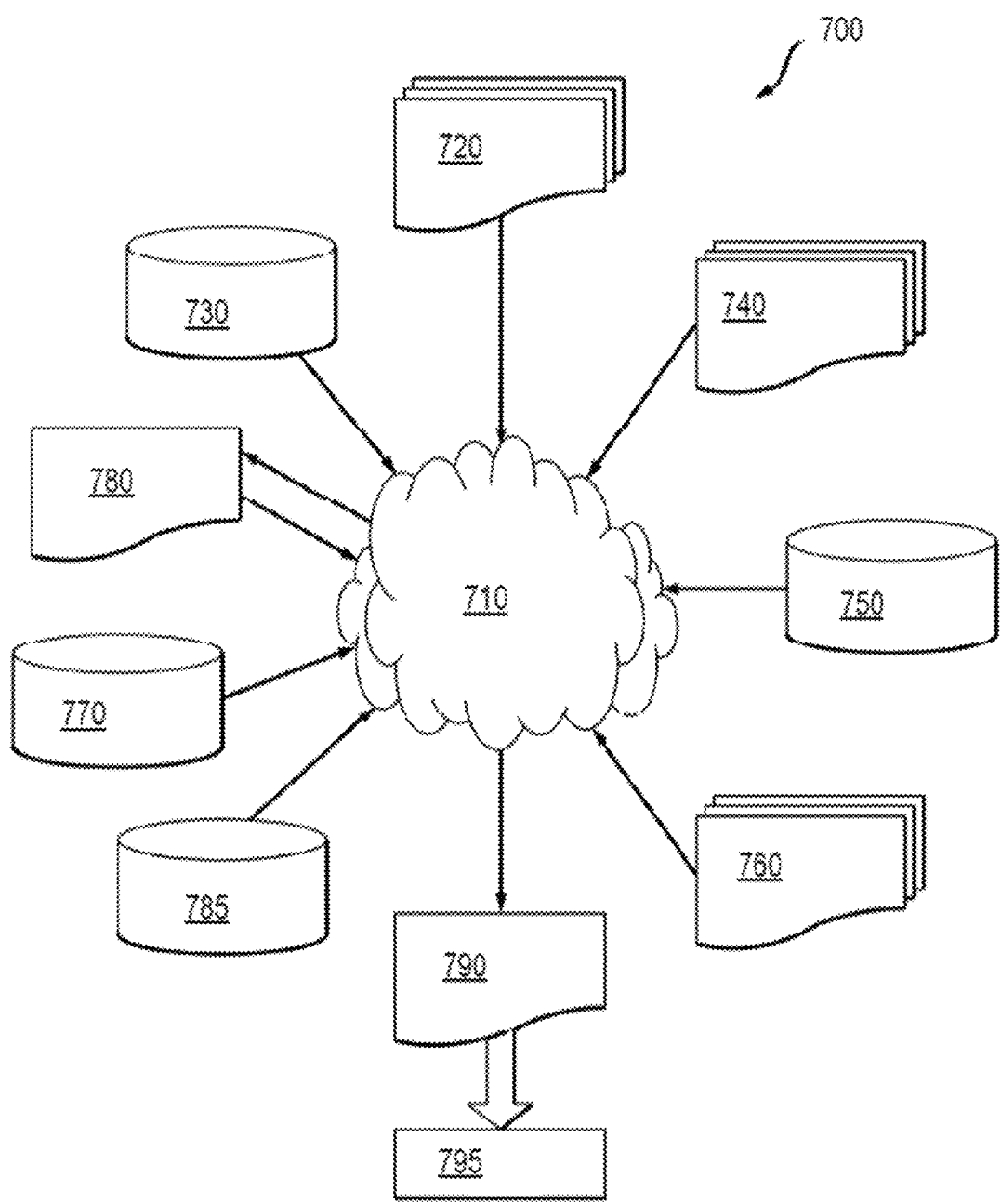
FIG. 5 is a flow diagram of a design process used in semiconductor design, manufacture, and/or test.
Figure 6:
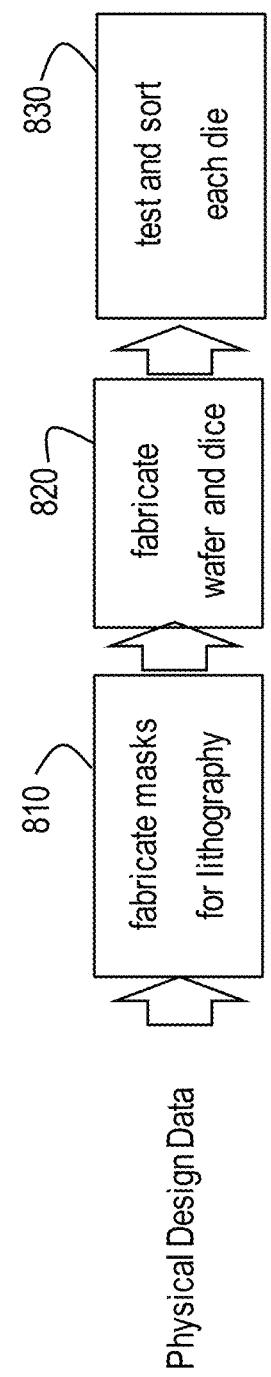
FIG. 6 shows further aspects of IC fabrication from physical design data.

Furthermore, referring to FIG. 5, in one or more embodiments the at least one processor is operative to generate a design structure for the integrated circuit design in accordance with the analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of the increase in testsite coverage due to the selection of circuit layouts that do not resemble each other) compared to circuits designed using prior art techniques.

Figure 7:
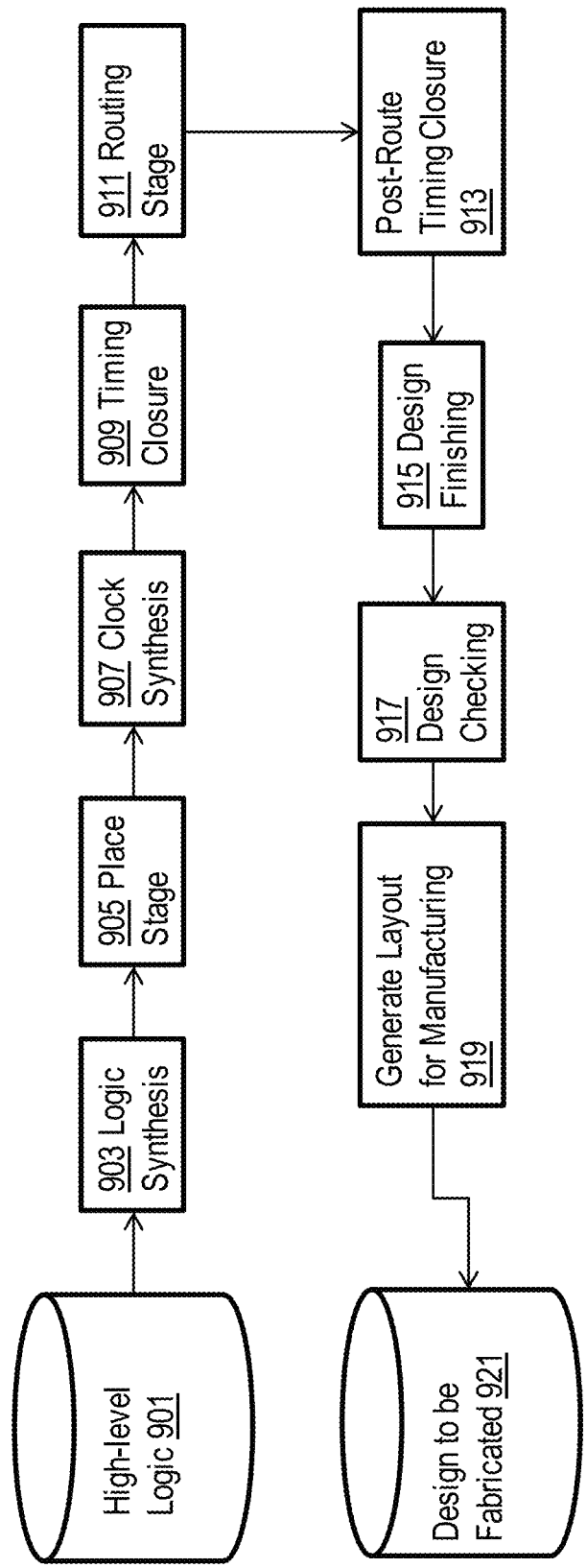
FIG. 7 shows an exemplary high-level Electronic Design Automation (EDA) tool flow, within which aspects of the invention can be employed.

FIG. 7 depicts an example high-level Electronic Design Automation (EDA) tool flow, which is responsible for creating an optimized microprocessor (or other IC) design to be manufactured. A designer could start with a high-level logic description 901 of the circuit (e.g. VHDL or Verilog). The logic synthesis tool 903 compiles the logic, and optimizes it without any sense of its physical representation, and with estimated timing information. In one example embodiment, the logic synthesis tool 903 utilizes the circuit layouts identified by the similarity matrix to, for example, increase the testsite coverage. The placement tool 905 takes the logical description and places each component, looking to minimize congestion in each area of the design. The clock synthesis tool 907 optimizes the clock tree network by cloning/balancing/buffering the latches or registers. The timing closure step 909 performs a number of optimizations on the design, including buffering, wire tuning, and circuit repowering; its goal is to produce a design which is routable, without timing violations, and without excess power consumption. The routing stage 911 takes the placed/optimized design, and determines how to create wires to connect all of the components, without causing manufacturing violations. Post-route timing closure 913 performs another set of optimizations to resolve any violations that are remaining after the routing. Design finishing 915 then adds extra metal shapes to the netlist, to conform with manufacturing requirements. The checking steps 917 analyze whether the design is violating any requirements such as manufacturing, timing, power, electromigration or noise. When the design is clean, the final step 919 is to generate a layout for the design, representing all the shapes to be fabricated in the design to be fabricated 921.

One or more embodiments of the invention, or elements thereof, can be implemented in the form of an apparatus including a memory and at least one processor that is coupled to the memory and operative to perform exemplary method steps. FIG. 8 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 8, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 8) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 5 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved via design can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, implemented at least in part on a computer, comprising:
    identifying one or more unique values for each of a set of measures for each circuit layout of a plurality of circuit layouts;
    conducting a pairwise comparison across the set of measures for a selected pair of the plurality of circuit layouts to derive a similarity score for the selected pair of circuit layouts;
    performing at least one action in response to the conducting the pairwise comparison, the action being one of incrementing the similarity score for the selected pair, decrementing the similarity score for the selected pair, and maintaining the similarity score for the selected pair;
    repeating the identifying, conducting, and performing operations for each unique pair of circuit layouts of the plurality of circuit layouts; and
    substituting an alternative circuit layout for a given circuit layout in a testsite based on the similarity score.

2. The method of claim 1, further comprising creating a similarity matrix of similarity scores across all circuit layouts of the plurality of circuit layouts.

3. The method of claim 2, further comprising obtaining a list of exclusion circuit layouts and determining a list of alternative circuit layouts based on the similarity matrix.

4. The method of claim 3, further comprising pruning the list of alternative circuit layouts using at least one of:
a greedy or heuristic algorithm; and
dynamic programming
to generate a representative set of circuit layouts.

5. The method of claim 1, further comprising computing a coverage metric using a selected set of circuit layouts.

6. The method of claim 5, further comprising adding a circuit layout to the selected set of circuit layouts until a coverage goal is satisfied or an iteration limit is reached.

7. The method of claim 5, further comprising adding a circuit layout to the selected set of circuit layouts, wherein the added circuit layout covers at least one unique value not covered by any circuit layout in the selected set of circuit layouts.

8. The method of claim 1, further comprising improving computing performance of a computer performing electronic design automation by reducing computational complexity in determining test site coverage, by identifying a circuit layout of the plurality of circuit layouts that is similar to a given circuit layout by conducting the pairwise comparison across the set of measures and deriving the similarity score using one or more of the unique values.

9. The method of claim 1, further comprising:
instantiating at least one of the plurality of circuit layouts as a design structure; and
fabricating a physical integrated circuit in accordance with the design structure.

10. The method of claim 1, wherein the incrementing the similarity score for the selected pair is performed in response to the selected pair of circuit layouts sharing a same unique value and the decrementing the similarity score for the selected pair is performed in response to one circuit layout of the selected pair of circuit layouts having a unique value that the other circuit layout of the selected pair does not contain.

11. A computer comprising:
a memory; and
at least one processor, coupled to said memory, and operative to perform operations comprising:
identifying one or more unique values for each of a set of measures for each circuit layout of a plurality of circuit layouts;
conducting a pairwise comparison across the set of measures for a selected pair of the plurality of circuit layouts to derive a similarity score for the selected pair of circuit layouts;
performing at least one action in response to the conducting the pairwise comparison, the action being one of incrementing the similarity score for the selected pair, decrementing the similarity score for the selected pair, and maintaining the similarity score for the selected pair;
repeating the identifying, conducting, and performing operations for each unique pair of circuit layouts of the plurality of circuit layouts; and
substituting an alternative circuit layout for a given circuit layout based on the similarity score.

12. The computer of claim 11, wherein the at least one processor is further operative to create a similarity matrix of similarity scores across all circuit layouts of the plurality of circuit layouts.

13. The computer of claim 12, wherein the at least one processor is further operative to obtain a list of exclusion circuit layouts and determining a list of alternative circuit layouts based on the similarity matrix.

14. The computer of claim 13, wherein the at least one processor is further operative to prune the list of alternative circuit layouts using at least one of:
a greedy or heuristic algorithm; and
dynamic programming
to generate a representative set of circuit layouts.

15. The computer of claim 11, wherein the at least one processor is further operative to compute a coverage metric using a selected set of circuit layouts.

16. The computer of claim 15, wherein the at least one processor is further operative to add a circuit layout to the selected set of circuit layouts until a coverage goal is satisfied or an iteration limit is reached.

17. The method of claim 15, the operations further comprising adding a circuit layout to the selected set of circuit layouts, wherein the added circuit layout covers at least one unique value not covered by any circuit layout in the selected set of circuit layouts.

18. The method of claim 11, the operations further comprising improving a computing performance, a computer performing electronic design automation by reducing computational complexity in determining test site coverage, by identifying a circuit layout of the plurality of circuit layouts that is similar to a given circuit layout by conducting the pairwise comparison across the set of measures and deriving the similarity score using one or more of the unique values.

19. The method of claim 11, the operations further comprising:
instantiating at least one of the plurality of circuit layouts as a design structure; and
fabricating a physical integrated circuit in accordance with the design structure.

20. A non-transitory computer readable medium comprising computer executable instructions which when executed by a computer performing electronic design analysis cause the computer to perform a method which improves the performance of the computer, the method comprising operations of:
identifying one or more unique values for each of a set of measures for each circuit layout of a plurality of circuit layouts;
conducting a pairwise comparison across the set of measures for a selected pair of the plurality of circuit layouts to derive a similarity score for the selected pair of circuit layouts;
performing at least one action in response to the conducting the pairwise comparison, the action being one of incrementing the similarity score for the selected pair, decrementing the similarity score for the selected pair, and maintaining the similarity score for the selected pair;
repeating the identifying, conducting, and performing operations for each unique pair of circuit layouts of the plurality of circuit layouts; and
substituting an alternative circuit layout for a given circuit layout based on the similarity score.

* * * * *